United States Patent
Chan et al.

(10) Patent No.: US 11,082,080 B1
(45) Date of Patent: Aug. 3, 2021

(54) TRANSCEIVER CIRCUIT

(71) Applicant: REALTEK SEMICONDUCTOR CORP., Hsinchu (TW)

(72) Inventors: Ka-Un Chan, Hsinchu (TW);
Yi-Chang Shih, Hsinchu (TW);
Yu-Che Yang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/134,779

(22) Filed: Dec. 28, 2020

(30) Foreign Application Priority Data

Jun. 12, 2020 (TW) .................................. 109119915

(51) Int. Cl.
*H03L 7/099* (2006.01)
*H03L 7/089* (2006.01)
*H04B 1/44* (2006.01)

(52) U.S. Cl.
CPC ............. *H04B 1/44* (2013.01); *H03L 7/0891* (2013.01); *H03L 7/099* (2013.01); *H03L 2207/50* (2013.01)

(58) Field of Classification Search
CPC .......... H04B 1/40; H04B 1/403; H04B 1/405; H04B 1/406; H04B 1/44; H03L 7/085; H03L 7/089; H03L 7/0891; H03L 7/0893; H03L 7/0895; H03L 7/0896; H03L 7/0898; H03L 7/099
See application file for complete search history.

(56) References Cited

U.S. PATENT DOCUMENTS

| 9,712,176 | B1* | 7/2017 | Rafi | H03L 7/099 |
| 2013/0229954 | A1* | 9/2013 | Narathong | H03B 28/00 370/280 |
| 2014/0162571 | A1* | 6/2014 | Endo | H03L 7/099 455/73 |
| 2017/0179964 | A1* | 6/2017 | Rombach | H03L 7/103 |
| 2018/0109281 | A1* | 4/2018 | Shih | H04B 1/40 |

OTHER PUBLICATIONS

Tan, Sam Chun-Geik et al. "An Ultra-Low-Cost High-Performance Bluetooth SoC in 0.11-μm CMOS." IEEE Journal of Solid-State Circuits, vol. 47, No. 11, Nov. 2012.

(Continued)

*Primary Examiner* — Diana J. Cheng
(74) *Attorney, Agent, or Firm* — Li & Cai Intellectual Property (USA) Office (57) ABSTRACT

A transceiver circuit includes a transceiver antenna, a transmitter circuit, a receiver circuit, a frequency synthesizer and a baseband circuit. The transmitter circuit transmits a radio frequency signal corresponding to a radio frequency through the transceiver antenna. The frequency synthesizer provides a first local oscillation signal and a second local oscillation signal having a first local oscillation frequency and a second local oscillation frequency, respectively. The baseband circuit operates in a transmitting mode and a receiving mode. In the transmitting mode, the frequency synthesizer provides the first local oscillation signal, and in the receiving mode, the frequency synthesizer provides the second local oscillation signal, the first local oscillation frequency is a non-integer multiple of the radio frequency, and the second local oscillation frequency is an integer multiple of the radio frequency.

12 Claims, 5 Drawing Sheets

(56) References Cited

OTHER PUBLICATIONS

Shih, Yi-Shing et al. "A 55nm, 0.6mm2 Bluetooth SoC Integrated in Cellular Baseband Chip with Enhanced Coexistence." 2013 IEEE Asian Solid-State Circuits Conference (A-SSCC), 2013.
Prummel, Jan et al. "A 10 mW Bluetooth Low-Energy Transceiver With On-Chip Matching." IEEE Journal of Solid-State Circuits, 2015.
Yang, Wei et al. "A +8dBm BLE/BT Transceiver with Automatically Calibrated Integrated RF Bandpass Filter and -58dBc TX HD2." ISSCC 2011 /Session 7 /Wireless Transceivers / 7.6 pp. 18-20, 2017.

\* cited by examiner

TRANSCEIVER CIRCUIT

CROSS-REFERENCE TO RELATED PATENT APPLICATION

This application claims the benefit of priority to Taiwan Patent Application No. 109119915, filed on Jun. 12, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a transceiver circuit, and more particularly to a transceiver circuit having a transmitter and a receiver that can be optimized individually.

BACKGROUND OF THE DISCLOSURE

In recent years, Bluetooth technology has been widely used in various electronic devices so that such electronic devices can perform low-power data transmission in a short distance.

Currently, output signals corresponding to various wireless transmission standards are often modulated from an oscillation signal with a single frequency. When a frequency of an oscillating signal is designed to be an integer multiple of the radio frequency, transmitter pulling effect can cause phase errors or frequency offset and reduce the performance of the transmitter.

In order to avoid the transmitter pulling effect, the frequency of the oscillation signal can be designed at a non-integer multiple of the radio frequency. However, local oscillation signal with non-integer multiple frequencies can cause higher power consumption on the receiver.

Therefore, providing a transceiver circuit having a transmitter and a receiver that can be optimized individually has become an important topic in the art.

SUMMARY OF THE DISCLOSURE

In response to the above-referenced technical inadequacies, the present disclosure provides a transceiver circuit that can be optimized for a transmitter and a receiver, respectively.

In one aspect, the present disclosure provides a transceiver circuit, which comprises a transceiver antenna, a transmitter circuit, a receiver circuit, a frequency synthesizer, and a baseband circuit. The transmitter circuit is coupled to the transceiver antenna and configured to transmit a radio frequency signal through the transceiver antenna. The radio frequency signal corresponds to a radio frequency. The receiver circuit is coupled to the transceiver antenna and configured to receive an external signal with the radio frequency through the transceiver antenna. The frequency synthesizer is coupled to the transmitter circuit and the receiver circuit, the frequency synthesizer comprises an oscillator, and is configured to provide a first local oscillation signal and a second local oscillation signal. The first local oscillation signal has a first local oscillation frequency, and the second local oscillation signal has a second local oscillation frequency. The baseband circuit is coupled to the transmitter circuit, the receiver circuit and the frequency synthesizer, and is configured to operate in a transmitting mode and a receiving mode. In the transmitting mode, the baseband circuit is configured to control the frequency synthesizer to provide the first local oscillation signal, and to provide an input signal to the transmitter circuit, and the transmitter circuit is configured to process the input signal according to the first local oscillation signal, and transmit the radio frequency signal through the transceiver antenna. In the receiving mode, the baseband circuit is configured to control the frequency synthesizer to provide the second local oscillation signal, and the receiver circuit is configured to process the external signal according to the second local oscillation signal, and transmit the processed external signal to the baseband circuit. The first local oscillation frequency is a non-integer multiple of the radio frequency, and the second local oscillation frequency is an integer multiple of the radio frequency.

In conclusion, the transceiver circuit provided by the present disclosure can provide a local oscillation signal with a non-integer multiple of the radio frequency in the transmitting mode to avoid the transmitter pulling effect, and can also provide a local oscillation signal having integer multiples of the radio frequency in the receiving mode. Therefore, power consumption of the receiver can be optimized, thereby satisfying the low power consumption requirement of the receiver.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
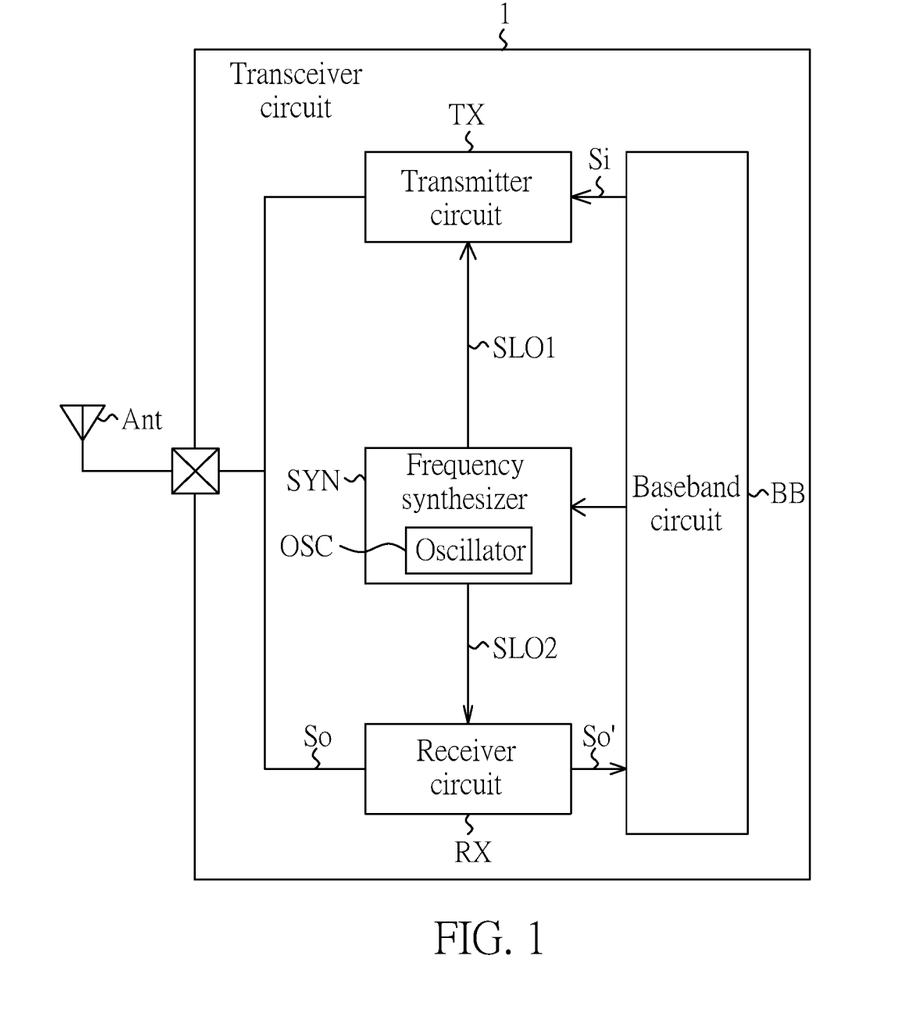
FIG. 1 is a block schematic diagram of a transceiver circuit according to an embodiment of the present disclosure.

FIG. 1 is a block schematic diagram of a transceiver circuit according to an embodiment of the present disclosure.

Reference is made to FIG. 1, an embodiment of the present disclosure provides a transceiver circuit 1, which includes a transceiver antenna Ant, a transmitter circuit TX, a receiver circuit RX, a frequency synthesizer SYN, and a baseband circuit BB.

Figure 2:
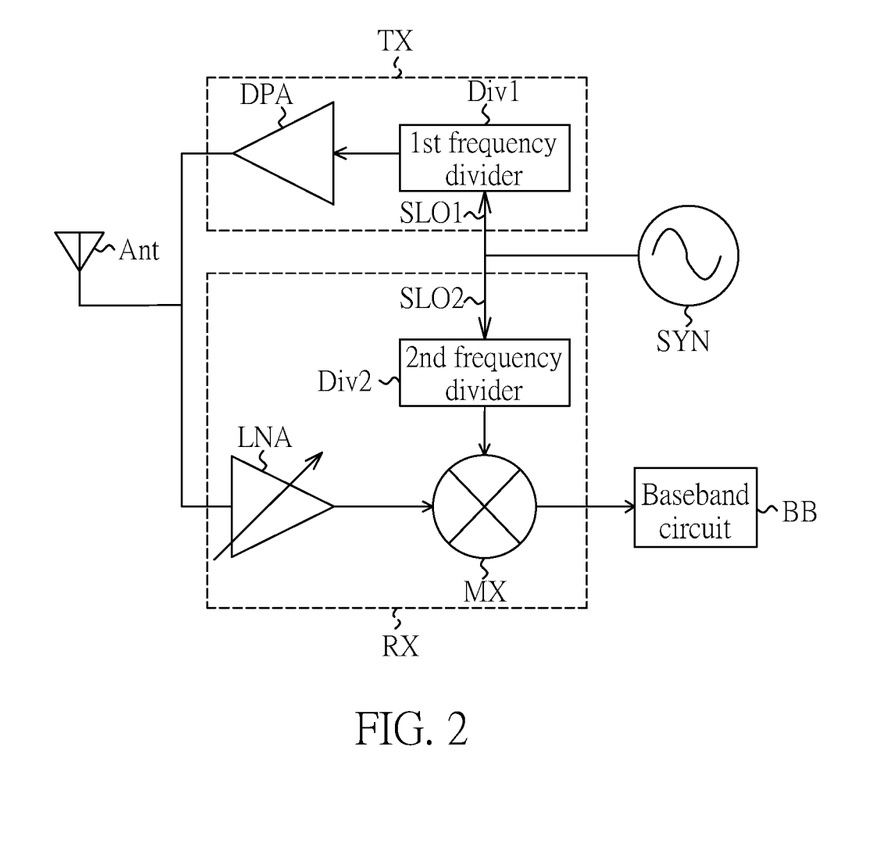
FIG. 2 is a schematic structural diagram of a transceiver antenna, a transmitter circuit, a receiver circuit, and a frequency synthesizer according to an embodiment of the present disclosure.

The transmitter circuit TX is coupled to the transceiver antenna Ant and configured to transmit a radio frequency (RF) signal through the transceiver antenna Ant. The radio frequency signal corresponds to a radio frequency, for example, 2.4 GHz. Reference can be further made to FIG. 2, which is a structural schematic diagram of a transceiver antenna, a transmitter circuit, a receiver circuit, and a frequency synthesizer according to an embodiment of the present disclosure. The transmitter circuit TX can include a digital power amplifier DPA and a first frequency divider Div1 coupled to the frequency synthesizer SYN. In FIG. 1, the receiver circuit RX is coupled to the transceiver antenna Ant to receive the external signal So having the radio frequency through the transceiver antenna Ant. As shown in FIG. 2, the receiver circuit RX can include a low noise amplifier LNA, a second frequency divider Div2 coupled to the frequency synthesizer SYN, and a mixer MX coupled to the second frequency divider Div2 and the low noise amplifier LNA.

The frequency synthesizer SYN is coupled to the transmitter circuit TX and the receiver circuit RX, and includes an oscillator OSC, and the frequency synthesizer SYN is configured to provide a first local oscillation signal SLO1 and a second local oscillation signal SLO2. The first local oscillation signal SLO1 has a first local oscillation frequency, and the second local oscillation signal SLO2 has a second local oscillation frequency.

The baseband circuit BB can be, for example, a digital baseband circuit, which is coupled to the transmitter circuit TX, the receiver circuit RX, and the frequency synthesizer SYN, and is configured to operate in a transmitting mode and a receiving mode, respectively.

In the transmitting mode, the baseband circuit BB is configured to control the frequency synthesizer SYN to provide the first local oscillation signal SLO1 and provide an input signal Si to the transmitter circuit TX. Therefore, the transmitter circuit TX can process the input signal Si according to the first local oscillation signal SLO1 to transmit the radio frequency signal through the transceiver antenna Ant. Therefore, as shown in FIG. 2, the first frequency divider Div1 can be configured to receive the first local oscillation signal SLO1 in the transmitting mode, divide the first local oscillation signal SLO1 by a non-integer multiple, and perform signal amplification through the digital power amplifier DPA to emit the radio frequency signals associated with the transmitting mode according to the input signal Si. The first local oscillation frequency is a non-integer multiple of the radio frequency. For example, in a preferred embodiment, the first local oscillation frequency can be 3.6 GHz and the non-integer multiple can be 1.5, but the present disclosure is not limited thereto.

In other words, when the transmitter circuit TX operates in the transmitting mode, the baseband circuit BB can control the frequency synthesizer SYN to provide the local oscillation signal with the non-integer multiple of the radio frequency (for example, 3.6 GHz, which is 1.5 times of 2.4 GHz) to avoid the transmitter pulling effect.

On the other hand, in the receiving mode, the baseband circuit BB is configured to control the frequency synthesizer SYN to provide the second local oscillation signal SLO2, and the receiver circuit RX can process the external signal So according to the second local oscillation signal SLO2 to transmit a processed external signal So' to the baseband circuit BB.

As shown in FIG. 2, the second frequency divider Div2 can receive the second local oscillation signal SLO2 in the receiving mode, and divide the second local oscillation signal SLO2 by an integer multiple, so that the mixer MX can mix the external signal So amplified by the low noise amplifier LNA and the divided second local oscillation signal SLO2 to generate the processed external signal So'. The second local oscillation frequency is an integer multiple of the radio frequency. For example, in a preferred embodiment, the second local oscillation frequency may be 4.8 GHz, and the integer multiple is 2.

In other words, when the receiver circuit RX operates in the receiving mode, the baseband circuit BB can control the frequency synthesizer SYN to provide the local oscillation signal with the integer multiple of the radio frequency (for example, 4.8 GHz, which is twice of 2.4 GHz). In this way, the transceiver circuit of the present disclosure can not only provide a solution for the transmitter pulling effect, but also optimize power consumption for the receiver to satisfy the receiver's low power consumption requirement.

Figure 3:
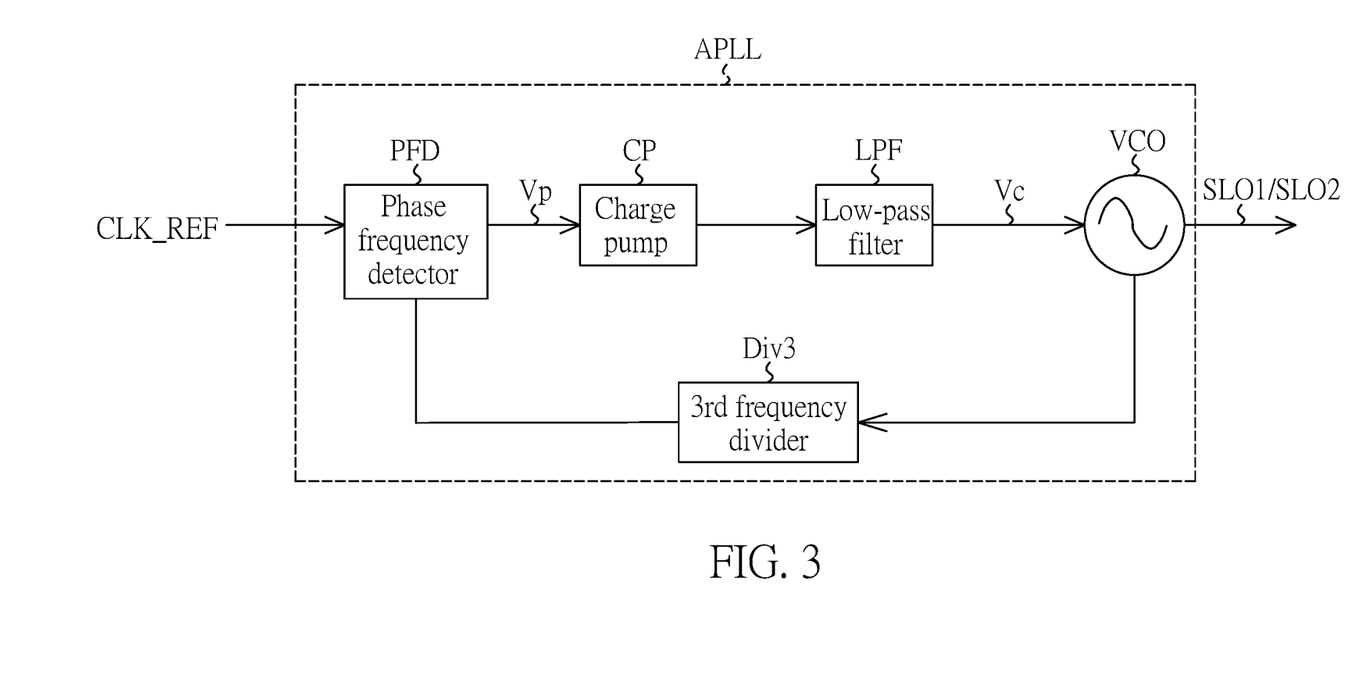
FIG. 3 is a block schematic diagram of an analog phase-locked loop according to an embodiment of the present disclosure.

The details of the frequency synthesizer SYN are further described below. Reference is further made to FIG. 3, which is a block schematic diagram of an analog phase-locked loop according to an embodiment of the present disclosure. As shown in FIG. 3, in some embodiments, the oscillator OSC can be a voltage-controlled oscillator VCO and the frequency synthesizer SYN can include an analog phase-locked loop APLL.

As shown in FIG. 3, the analog phase-locked loop APLL may include a phase frequency detector PFD, a charge pump CP, a low-pass filter LPF and a third frequency divider Div3. The analog phase-locked loop APLL is a feedback control system, which is mainly used to change an oscillation frequency of the voltage-controlled oscillator VCO, so that a feedback signal can track an input reference clock signal, then the feedback signal can be synchronized with frequency and phase of the reference clock signal, and an output sine wave with a multiple of the frequency of the reference clock signal can be generated at an output end of the analog phase-locked loop APLL.

In the present embodiment, the phase frequency detector PFD is used to receive the reference clock signal CLK_REF, the charge pump CP is coupled to the phase frequency detector PFD, the low-pass filter LPF is coupled to the charge pump CP and the voltage-controlled oscillator VCO, and the third frequency divider Div3 is coupled to the voltage-controlled oscillator VCO and the phase frequency detector PFD.

The phase frequency detector PFD is configured to detect a phase difference between a reference clock signal CLK_REF and an output signal of the third frequency divider Div3, and generate a detection voltage Vp to control the charge pump CP to charge or discharge the low-pass filter LPF, such that the low-pass filter correspondingly generates a control voltage Vc to adjust the voltage-controlled oscillator VCO, thereby generating the first local oscillation signal SLO1 or the second local oscillation signal SLO2.

Figure 4:
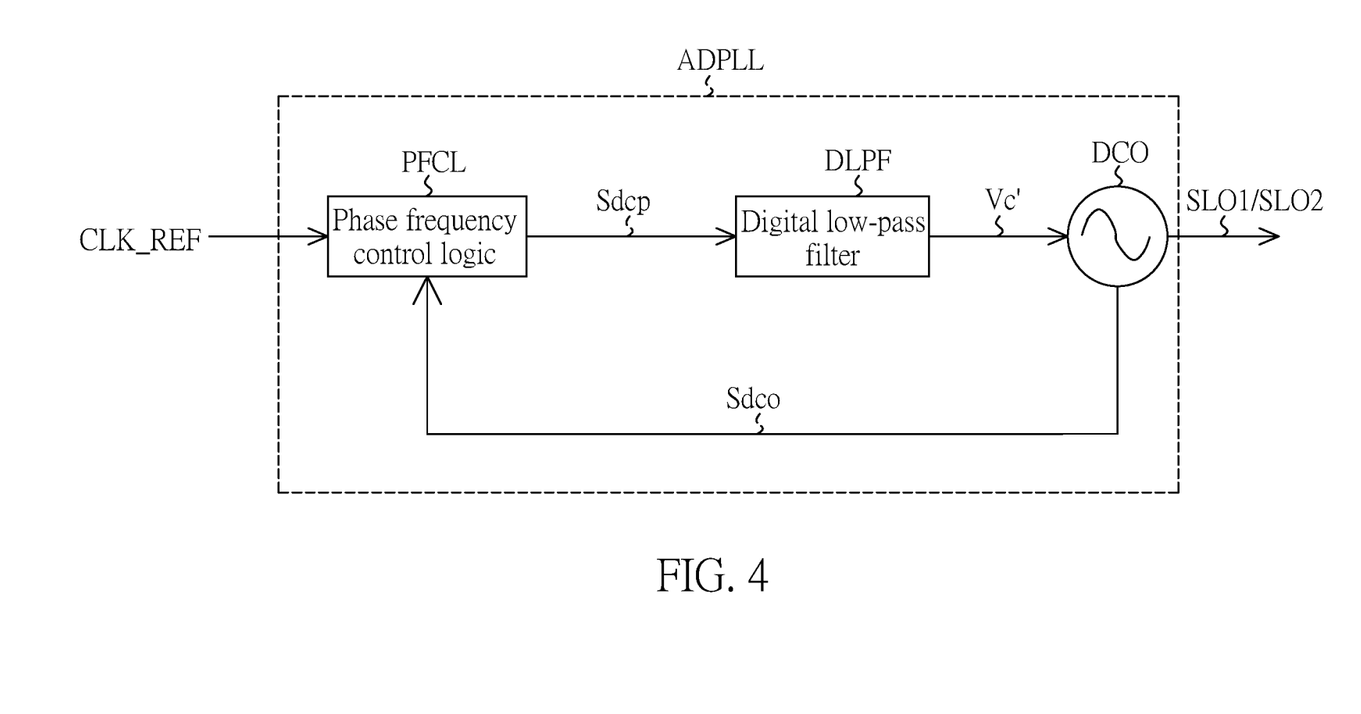
FIG. 4 is a block schematic diagram of a full digital phase-locked loop according to an embodiment of the present disclosure.

In addition, the frequency synthesizer SYN can also be implemented by a digital approach. Reference is made to FIG. 4, which is a block schematic diagram of an all-digital phase-locked loop according to an embodiment of the present disclosure. The oscillator OSC can be set as a digitally controlled oscillator DCO, which is configured to generate a digitally controlled oscillation signal Sdco, and the frequency synthesizer SYN can include an all-digital phase-locked loop ADPLL.

As shown in FIG. 4, the all-digital phase-locked loop ADPLL includes a phase frequency control logic PFCL and a digital low-pass filter DLPF. Similarly, the phase frequency control logic PFCL receives the reference clock signal CLK_REF and the digitally controlled oscillation signal Sdco, and is configured to detect a phase difference of the reference clock signal CLK_REF and the digitally controlled oscillation signal Sdco, and correspondingly output a digital comparison signal Sdcp.

On the other hand, the digital low-pass filter DLPF is coupled to the phase frequency control logic PFCL and the digitally controlled oscillator DCO, and is configured to generate a voltage-controlled signal Vc' according to the digital comparison signal Sdcp to adjust the digitally controlled oscillator DCO, thereby generating the first local oscillation signal SLO1 or the second local oscillation signal SLO2.

In detail, the all-digital phase-locked loop ADPLL can be used as a frequency generator that provides high speed adjustment, accuracy, and wide bandwidth, and has features of fast conversion, high resolution, small area, and low power. For example, an operating procedure of such all-digital phase-locked loop ADPLL basically utilizes the phase frequency control logic PFCL to compare a rising edge or a falling edge of the digitally controlled oscillation signal Sdco with a rising edge or a falling edge of the reference clock signal CLK_REF.

Taking the rising edge as an example, when the rising edge of the digitally controlled oscillation signal Sdco arrives before the rising edge of the reference clock signal CLK_REF, the digital comparison signal Sdcp with a low potential is output, otherwise, the digital comparison signal Sdcp with a high potential is output. The digital low-pass filter DLPF generates a corresponding voltage-controlled signal Vc' according to the high or low potential of the digital comparison signal Sdcp. Control characters of the voltage-controlled signal Vc' are input to the digitally controlled oscillator DCO, which is also used to determine the oscillation frequency of the digitally controlled oscillator DCO. The digitally controlled oscillator DCO then generates the digitally controlled oscillation signal Sdco according to the voltage-controlled signal Vc' to be feedback to the phase frequency control logic PFCL. The digitally controlled oscillation signal Sdco is compared with the reference clock signal CLK_REF again so that the voltage-controlled signal Vc' can be modified repeatedly. In this manner, the frequency phase difference between the reference clock signal CLK_REF and the digitally controlled oscillation signal Sdco output by the digitally controlled oscillator DCO is minimized. The numbers of the high and low potentials of the digital comparison signal Sdcp can be zero when a locking action is achieved.

Figure 5A:
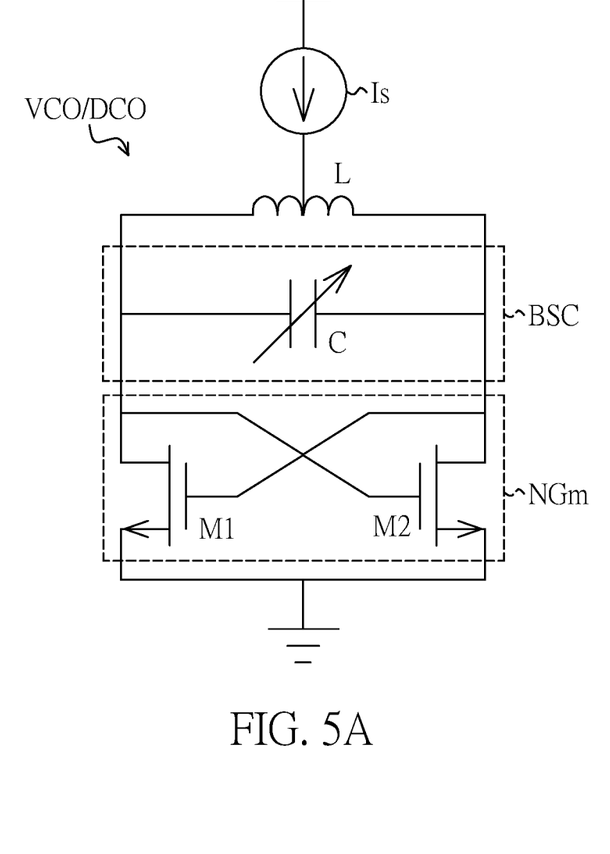
FIGS. 5A and 5B are circuit layout diagrams of a voltage-controlled oscillator and a digitally controlled oscillator, respectively, according to an embodiment of the present disclosure.
Figure 5B:
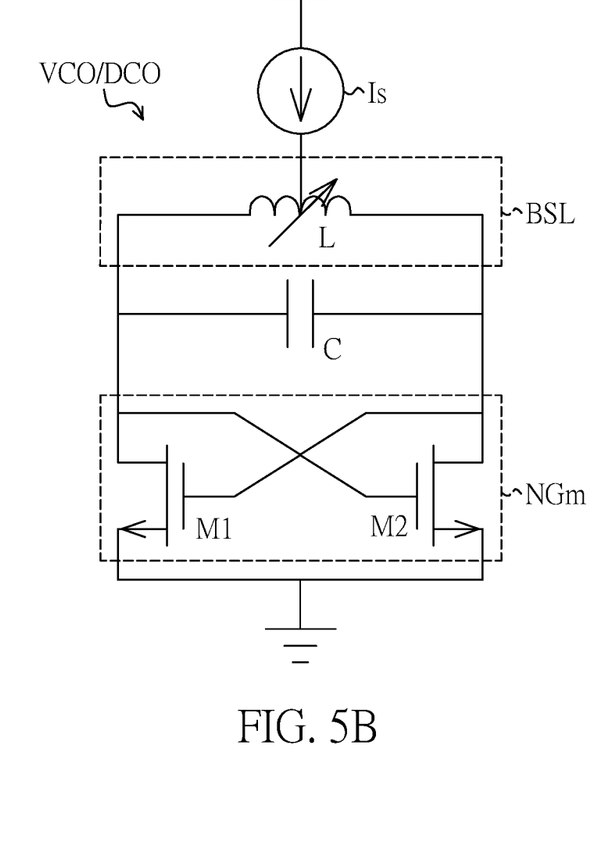

The following further describes possible implementations of the voltage-controlled oscillator VCO and the digitally controlled oscillator DCO. Reference is made to FIGS. 5A and 5B, which are circuit layout diagrams of a voltage-controlled oscillator and a digitally controlled oscillator, respectively, according to an embodiment of the present disclosure.

As shown in FIGS. 5A and 5B, the oscillator OSC (which can be a voltage-controlled oscillator VCO or a digitally controlled oscillator DCO) includes a current source Is, an inductor L coupled to the current source Is, a capacitor C coupled in parallel with the inductor L, and a negative conductance device NGm coupled in parallel with the inductance L and the capacitance C.

FIGS. 5A and 5B show inductance-capacitance controlled oscillators, which use a negative resistance to compensate losses caused by a parasitic resistance of a resonator tank. Control of the frequency of the inductance-capacitance controlled oscillator can be achieved by changing the capacitance C or the inductance L. For the architectures provided in FIGS. 5A and 5B, cross-coupled pair of transistors formed by a first transistor M1 and a second transistor M2 can be used to generate negative resistance. When an input impedance is less than or equal to the loss of the resonant tank, oscillation can occur.

As in FIG. 5A, the capacitor C is a variable capacitor and can be used as a band selection capacitor BSC, while in FIG. 5B, the inductor L is a variable inductance and can be used as a band selection inductor BSL. By adjusting the magnitude of the variable capacitor or the variable inductor, the frequency of the inductance-capacitance controlled oscillator can be controlled, thereby generating the first local oscillation signal SLO1 and the second local oscillation signal SLO2 with non-integer and integer multiples of the radio frequency, respectively. In other words, at least one of the inductance L and the capacitor C is variable and can be controlled by the baseband circuit BB, or by other control circuits, and the present disclosure is not limited thereto.

In conclusion, the transceiver circuit provided by the present disclosure can provide a local oscillation signal with a non-integer multiple of the radio frequency in the transmitter mode to avoid the transmitter pulling effect, and can also provide a local oscillation signal having integer multiples of the radio frequency in the receiving mode. Therefore, power consumption of the receiver can be optimized, thereby satisfying the low power consumption requirement of the receiver.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

What is claimed is:

1. A transceiver circuit, comprising:
a transceiver antenna;
a transmitter circuit coupled to the transceiver antenna and configured to transmit a radio frequency signal through the transceiver antenna, wherein the radio frequency signal corresponds to a radio frequency;
a receiver circuit coupled to the transceiver antenna and configured to receive an external signal with the radio frequency through the transceiver antenna;
a frequency synthesizer coupled to the transmitter circuit and the receiver circuit, comprising only one oscillator, and configured to provide a first local oscillation signal and a second local oscillation signal, wherein the first local oscillation signal has a first local oscillation frequency, and the second local oscillation signal has a second local oscillation frequency; and
a baseband circuit coupled to the transmitter circuit, the receiver circuit and the frequency synthesizer, and configured to operate in a transmitting mode and a receiving mode,
wherein in the transmitting mode, the baseband circuit is configured to control the frequency synthesizer to provide the first local oscillation signal and provide an input signal to the transmitter circuit, and the transmitter circuit is configured to process the input signal according to the first local oscillation signal, and transmit the radio frequency signal through the transceiver antenna,
wherein in the receiving mode, the baseband circuit is configured to control the frequency synthesizer to provide the second local oscillation signal, and the receiver circuit is configured to process the external signal according to the second local oscillation signal, and transmit the processed external signal to the baseband circuit,
wherein the first local oscillation frequency is a non-integer multiple of the radio frequency, and the second local oscillation frequency is an integer multiple of the radio frequency.

2. The transceiver circuit according to claim 1, wherein the transmitter circuit comprises a first frequency divider coupled to the frequency synthesizer, and configured to receive the first local oscillation signal in the transmitting mode and to divide the first local oscillation signal by a non-integer multiple.

3. The transceiver circuit according to claim 2, wherein the first local oscillation frequency is 3.6 GHz, and the non-integer multiple is 1.5.

4. The transceiver circuit according to claim 1, wherein the receiver circuit comprises a second frequency divider coupled to the frequency synthesizer, and configured to receive the second local oscillation signal in the receiving mode and to divide the second local oscillation signal by an integer multiple.

5. The transceiver circuit according to claim 4, wherein the second local oscillation frequency is 4.8 GHz, and the integer multiple is 2.

6. The transceiver circuit according to claim 4, wherein the receiver circuit further comprises a mixer configured to mix the external signal and the divided second local oscillation signal to generate the processed external signal.

7. The transceiver circuit of claim 1, wherein the oscillator is a voltage-controlled oscillator configured to generate a voltage-controlled oscillation signal, and the frequency synthesizer comprises an analog phase-locked loop, which comprises:
a phase frequency detector configured to receive a reference clock signal;
a charge pump coupled to the phase frequency detector;
a low-pass filter coupled to the charge pump and the voltage-controlled oscillator; and
a third frequency divider coupled to the voltage-controlled oscillator and the phase frequency detector,
wherein the phase frequency detector is configured to detect a phase difference between the reference clock signal and an output signal of the third frequency divider, and generate a detection voltage to control the charge pump to charge and discharge the low-pass filter, such that the low-pass filter correspondingly generates a control voltage to adjust the voltage-controlled oscillator, thereby generating the first local oscillation signal or the second local oscillation signal.

8. The transceiver circuit according to claim 1, wherein the oscillator is a digitally controlled oscillator configured to generate a digitally controlled oscillation signal, and the frequency synthesizer comprises an all-digital phase-locked loop, which comprises:
a phase frequency control logic receiving a reference clock signal and the digitally controlled oscillation signal, and configured to detect a phase difference between the reference clock signal and the digitally controlled oscillation signal, and correspondingly output a digital comparison signal; and
a digital low-pass filter coupled to the phase frequency control logic and the digitally controlled oscillator, and configured to generate a voltage control signal according to the digital comparison signal to adjust the digitally controlled oscillator, thereby generating the first local oscillation signal or the second local oscillation signal.

9. The transceiver circuit according to claim 7, wherein the oscillator comprises:
a current source;
an inductor coupled to the current source;
a capacitor coupled in parallel with the inductor; and
a negative conductance device coupled in parallel with the inductor and the capacitor,
wherein at least one of the inductor and the capacitor is variable and is controlled by the baseband circuit.

10. The transceiver circuit according to claim 9, wherein the negative conductance device is a cross-coupled pair of transistors.

11. The transceiver circuit according to claim 8, wherein the oscillator comprises:
a current source;
an inductor coupled to the current source;
a capacitor coupled in parallel with the inductor; and
a negative conductance device coupled in parallel with the inductor and the capacitor,
wherein at least one of the inductor and the capacitor is variable and is controlled by the baseband circuit.

12. The transceiver circuit according to claim 11, wherein the negative conductance device is a cross-coupled pair of transistors.

* * * * *